United States Patent
Moon et al.

(10) Patent No.: US 9,345,142 B2
(45) Date of Patent: May 17, 2016

(54) CHIP EMBEDDED BOARD AND METHOD OF MANUFACTURING THE SAME

(71) Applicant: SAMSUNG ELECTRO-MECHANICS CO., LTD., Suwon-Si (KR)

(72) Inventors: Seon Hee Moon, Suwon-Si (KR); Young Do Kweon, Suwon-Si (KR); Jeong Ho Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/538,797

(22) Filed: Nov. 11, 2014

(65) Prior Publication Data

US 2015/0138741 A1    May 21, 2015

(30) Foreign Application Priority Data

Nov. 21, 2013  (KR) .................. 10-2013-0142235
Sep. 5, 2014   (KR) .................. 10-2014-0119243

(51) Int. Cl.
| H05K 1/18 | (2006.01) |
| H05K 3/46 | (2006.01) |
| H01L 21/66 | (2006.01) |
| H01L 23/14 | (2006.01) |

(52) U.S. Cl.
CPC .............. *H05K 1/185* (2013.01); *H05K 3/4644* (2013.01); *H05K 3/4697* (2013.01); *H01L 22/34* (2013.01); *H01L 23/14* (2013.01)

(58) Field of Classification Search
CPC ... H05K 1/185; H05K 3/4644; H05K 3/4697; H01L 22/34; H01L 23/14
See application file for complete search history.

(56) References Cited

U.S. PATENT DOCUMENTS

| 2005/0087850 A1* | 4/2005 | Nishikawa et al. ........... 257/678 |
| 2006/0128069 A1* | 6/2006 | Hsu ............................... 438/124 |
| 2008/0102410 A1* | 5/2008 | Kim et al. ..................... 430/312 |
| 2014/0062607 A1* | 3/2014 | Nair et al. ....................... 331/68 |

FOREIGN PATENT DOCUMENTS

JP        2004-79739      3/2004

* cited by examiner

*Primary Examiner* — Armando Rodriguez
(74) *Attorney, Agent, or Firm* — NSIP Law

(57) ABSTRACT

There are provided a chip embedded board and a method of manufacturing the same. The chip embedded board includes: a core substrate; a first build-up layer formed on one surface of the core substrate and having a cavity formed therein; a chip disposed in the cavity; and an insulating layer filled in the cavity in which the chip is disposed, wherein one surface of the chip is positioned in a circuit layer positioned at the outermost layer of the first build-up layer.

7 Claims, 8 Drawing Sheets

CHIP EMBEDDED BOARD AND METHOD OF MANUFACTURING THE SAME

CROSS-REFERENCE TO RELATED APPLICATION

This application claims the foreign priority benefits of Korean Patent Application No. 10-2013-0142235, filed on Nov. 21, 2013 and Korean Patent Application No. 10-2014-0119243, filed on Sep. 5, 2014, entitled "Chip Embedded Board and Method of Manufacturing the Same" which are hereby incorporated by reference in its entirety into this application.

BACKGROUND

The present disclosure relates to a chip embedded board and a method of manufacturing the same.

Recently, in order to satisfy a demand for miniaturization and improvement of a function of an electronic product in accordance with advancement of an electronic industry, a technology of the electronic industry has been developed toward allowing a board to serve as a resistor, a capacitor, an integrated circuit (IC), and the like.

Until now, general discrete chip resistors or general discrete chip capacitors have been mounted on surfaces of most of the boards. However, recently, a board in which a chip type component such as a resistor, a capacitor, or the like, is embedded has been developed.

In the chip component embedded board technology, the chip type component such as the resistor, the capacitor, or the like, is inserted into an inner layer of the board using a new material and process.

In other words, the chip embedded board has a form in which, for example, the chip type capacitor is buried in the inner layer of the board itself. A type in which a chip is integrated as a portion of the board with the board regardless of a size of the board itself is called a "chip embedded type", and a board having this type is called a chip embedded board or a chip embedded printed circuit board.

RELATED ART DOCUMENT

Patent Document (Patent Document 1) Japanese Patent Laid-Open Publication No. 2004-079739

SUMMARY

An aspect of the present disclosure may provide a chip embedded board capable of embedding a chip thicker than a core substrate therein, and a method of manufacturing the same.

Another aspect of the present disclosure may provide a chip embedded board capable of improving reliability by preventing warpage and a crack thereof, and a method of manufacturing the same.

According to an aspect of the present disclosure, a chip embedded board may include: a core substrate; a first build-up layer formed on one surface of the core substrate and having a cavity formed therein; a chip disposed in the cavity; and an insulating layer filled in the cavity in which the chip is disposed, wherein one surface of the chip is positioned in a circuit layer positioned at the outermost layer of the first build-up layer.

The cavity may be formed so as to penetrate through both of the first build-up layer and the core substrate.

The cavity may be formed in a groove structure in the core substrate while penetrating through the first build-up layer.

The cavity may be formed in a groove structure in the first build-up layer.

The cavity may be formed so as to penetrate through the first build-up layer.

The chip embedded board may further include a second build-up layer formed on the other surface of the core substrate.

The cavity may be formed so as to penetrate through the first build-up layer, the core substrate, and the second build-up layer.

According to another aspect of the present disclosure, a method of manufacturing a chip embedded board may include: forming a first build-up layer on one surface of a core substrate, the first build-up layer having a cavity formed therein; disposing a chip in the cavity; and forming an insulating layer in the cavity in which the chip is disposed.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
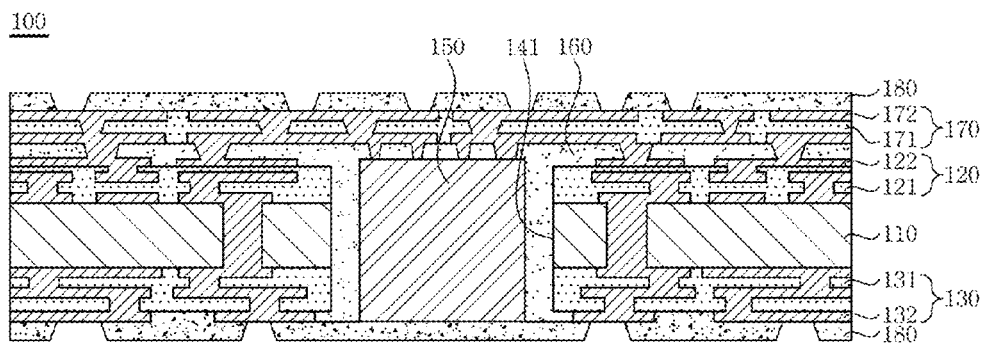
FIG. 1 is an illustrative view showing a chip embedded board according to a first exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

Chip Embedded Board

FIG. 1 is an illustrative view showing a chip embedded board according to a first exemplary embodiment of the present disclosure.

Referring to FIG. 1, a chip embedded board 100 according to a first exemplary embodiment of the present disclosure may include a core substrate 110, a first build-up layer 120, a second build-up layer 130, a chip 150, an insulating layer 160, a third build-up layer 170, and protecting layers 180.

According to an exemplary embodiment of the present disclosure, the core substrate 110 is formed of a composite polymer resin generally used as an interlayer insulating material. For example, the core substrate 110 may be formed of a thermosetting resin such as an epoxy resin, or a thermoplastic resin such as polyimide. Alternatively, the core substrate 110 may be formed of a resin in which a reinforcing material such as a glass fiber or an inorganic filler is impregnated in an epoxy resin such as prepreg. Alternatively, the core substrate 110 may be formed of a photo-curable resin. In addition, although not shown, the core substrate 110 may further include one or more circuit layers therein.

Alternatively, the core substrate 110 may be a ceramic substrate or a metal substrate on which an insulating film is formed. Alternatively, the core substrate 110 may be formed of a clad copper laminate (CCL).

According to an exemplary embodiment of the present disclosure, the first build-up layer 120 is formed on the core substrate 110. In addition, according to an exemplary embodiment of the present disclosure, the second build-up layer 130 is formed beneath the core substrate 110. The first build-up layer 120 according to an exemplary embodiment of the present disclosure may include one or more first build-up circuit layer 122 and first build-up insulating layer 121. In addition, the second build-up layer 130 may include one or more second build-up circuit layer 132 and second build-up insulating layer 131. Here, the first and second build-up insulating layers 121 and 131 are formed of a composite polymer resin used as an interlayer insulating material in a circuit board field. In addition, the first and second build-up circuit layers 122 and 132 are formed of a conductive material used in the circuit board field. For example, the first and second build-up circuit layers 122 and 132 are formed of copper.

According to an exemplary embodiment of the present disclosure, a cavity 141 is formed so as to penetrate through the core substrate 110, the first build-up layer 120, and the second build-up layer 130.

According to an exemplary embodiment of the present disclosure, the chip 150 is disposed in the cavity 141. The chip 150 disposed in the cavity 141 is a component electrically connected to the chip embedded board 100 to be in charge of a predetermined function. For example, the chip 150 may be an integrated circuit (IC) chip. However, a kind of chip 150 is not limited thereto.

According to an exemplary embodiment of the present disclosure, an upper surface of the chip 150 is positioned so as to correspond to the outermost layer of the first build-up layer 120. Here, the first build-up layer 120 has the first build-up circuit layer 122 formed at the outermost layer thereof. Therefore, the upper surface of the chip 150 is positioned in the first build-up circuit layer 122 positioned at the outermost layer of the first build-up layer 120. In other words, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

In addition, according to an exemplary embodiment of the present disclosure, a lower surface of the chip 150 may be positioned so as to correspond to the outermost layer of the second build-up layer 130. That is, the lower surface of the chip 150 is positioned on a lower surface of the second build-up insulating layer 131, on a lower surface of the second build-up circuit layer 132, or between the lower surface of the second build-up insulating layer 131 and the lower surface of the second build-up circuit layer 132.

In an exemplary embodiment of the present disclosure, since the cavity 141 in which the chip 150 is disposed is formed so as to penetrate through the first build-up layer 120, the core substrate 110, and the second build-up layer 130, the chip 150 thicker than the core substrate 110 may be embedded in the board.

Although not shown in FIG. 1, electrodes for electrical connection (not shown) are formed in the chip 150. Therefore, in the case in which the electrodes (not shown) are formed on upper and lower surfaces of the chip 150, the upper or lower surface of the chip 150 may become upper or lower surfaces of the electrodes (not shown). This content is also commonly applied to FIGS. 2 through 27.

According to an exemplary embodiment of the present disclosure, the insulating layer 160 is formed on the first build-up layer 120 and is formed so as to be filled in the cavity 141. The insulating layer 160 formed as described above buries the chip 150 disposed in the cavity 141 therein. According to an exemplary embodiment of the present disclosure, the insulating layer 160 is formed of a photosensitive insulating material. For example, the insulating layer 160 is formed of a photosensitive film or a solder resist. However, a kind of insulating layer 160 is not limited thereto, but may be any insulating material used in the circuit board field.

According to an exemplary embodiment of the present disclosure, the third build-up layer 170 is formed on the insulating layer 160. The third build-up layer 170 according to an exemplary embodiment of the present disclosure may include one or more third circuit layer 172 and third insulating layer 171. Here, the third insulating layer 171 is formed of a composite polymer resin used as an interlayer insulating material in the circuit board field. In addition, the third circuit layer 172 is formed of a conductive material used in the circuit board field. For example, the third circuit layer 172 is formed of copper.

According to an exemplary embodiment of the present disclosure, a portion of a circuit layer of the third build-up layer 170 is electrically connected to the chip 150 while penetrating through the insulating layer 160.

According to an exemplary embodiment of the present disclosure, the protecting layers 180 are formed beneath the second build-up layer 130 and on the third build-up layer 170.

The protecting layers 180 according to an exemplary embodiment of the present disclosure are formed in order to protect the second and third build-up layers 130 and 170 from the outside. Here, the protecting layer 180 is patterned so that portions of the second and third build-up layers 130 and 170 electrically connected to an external component are exposed to the outside. For example, the protecting layer 180 is formed of a solder resist.

According to an exemplary embodiment of the present disclosure, the cavity 141 in which the chip 150 is mounted is formed up to build-up layers formed on and beneath the core substrate 110 while passing through the core substrate 110. Therefore, the chip 150 thicker than the core substrate 110 may be mounted. In addition, since the thick chip 150 may be mounted in the core substrate 110, warpage or a crack of the chip embedded board 100 due to dispersion of stress by a process may be prevented.

In an exemplary embodiment of the present disclosure, the case in which the third build-up layer 170 is formed only on the first build-up layer 120 has been described by way of example. However, the chip embedded board 100 according to an exemplary embodiment of the present disclosure is not limited to the above-mentioned structure. Various build-up layers may be further formed or omitted on the first and second build-up layers 120 and 130. In addition, the second build-up layer 130 or the third build-up layer 170 may be omitted.

FIGS. 2 through 5 are illustrative views showing chip embedded boards according to second to fifth exemplary embodiments of the present disclosure.

Referring to FIGS. 2 through 5, chip embedded boards 200 through 500 according to second to fifth exemplary embodiments of the present disclosure may include a core substrate 110, a first build-up layer 120, a second build-up layer 130, a chip 150, an insulating layer 160, a third build-up layer 170, and protecting layers 180, respectively.

The core substrates 110, the first build-up layers 120, the second build-up layer 130, the insulating layer 160, the third build-up layer 170, and the protecting layer 180 of the chip embedded boards 200 to 500 according to second to fifth exemplary embodiments of the present disclosure are the same as those of the chip embedded board 100 according to a first exemplary embodiment of the present disclosure. Therefore, an overlapped description will be omitted, and a detailed description for these components will refer to the description for FIG. 1.

Figure 2:
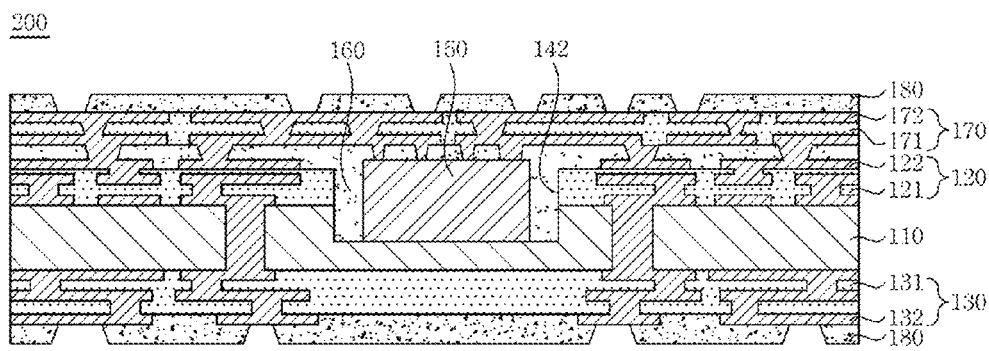
FIG. 2 is an illustrative view showing a chip embedded board according to a second exemplary embodiment of the present disclosure.

FIG. 2 is an illustrative view showing a chip embedded board according to a second exemplary embodiment of the present disclosure.

According to an exemplary embodiment of the present disclosure, a cavity 142 is formed so as to penetrate through the first build-up layer 120. In addition, the cavity 142 penetrating through the first build-up layer 120 is formed in a groove structure in the core substrate 110.

Also in this case, similar to a first exemplary embodiment, an upper surface of the chip 150 is positioned so as to correspond to the outermost layer of the first build-up layer 120. Here, the first build-up layer 120 has the first build-up circuit layer 122 formed at the outermost layer thereof. Therefore, the upper surface of the chip 150 is positioned in the first build-up circuit layer 122 positioned at the outermost layer of the first build-up layer 120. In other words, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

Figure 3:
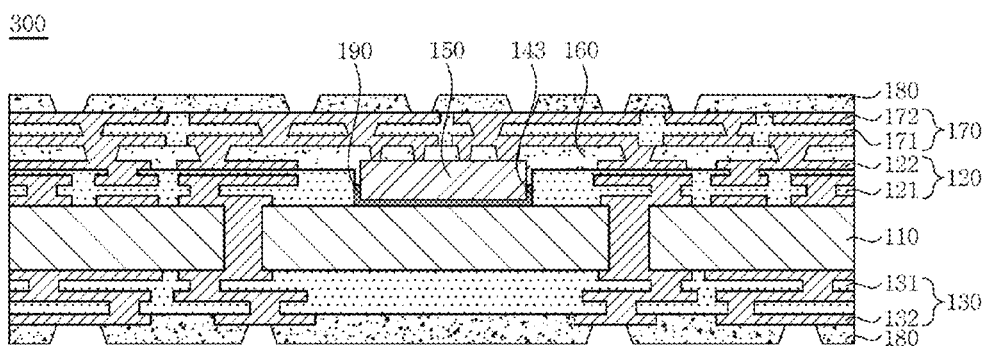
FIG. 3 is an illustrative view showing a chip embedded board according to a third exemplary embodiment of the present disclosure.

FIG. 3 is an illustrative view showing a chip embedded board according to a third exemplary embodiment of the present disclosure.

According to an exemplary embodiment of the present disclosure, a cavity 143 is formed so as to penetrate through only the first build-up layer 120. Here, a circuit layer of the first build-up layer 120 formed on an upper surface of the core substrate 110 is formed in a region in which the cavity 143 is not formed. The upper surface of the core substrate 110 is exposed by the cavity 143 formed as described above.

In the chip embedded board 300 according to a third exemplary embodiment of the present disclosure, similar to a first exemplary embodiment, an upper surface of the chip 150 is positioned so as to correspond to the outermost layer of the first build-up layer 120. That is, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

In addition, according to an exemplary embodiment of the present disclosure, an adhering layer 190 is formed between the chip 150 and the core substrate 110. As shown in FIG. 3, the adhering layer 190 is also formed on a portion of a side surface of the chip 150. The chip 150 is fixed to the cavity 143 by the adhering layer 190 formed as described above.

According to an exemplary embodiment of the present disclosure, the adhering layer 190 may be formed of any material used as an adhesive in the circuit board field.

Figure 4:
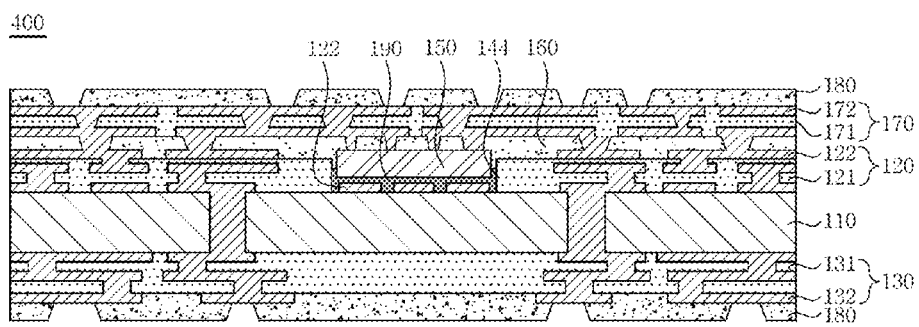
FIG. 4 is an illustrative view showing a chip embedded board according to a fourth exemplary embodiment of the present disclosure.

FIG. 4 is an illustrative view showing a chip embedded board according to a fourth exemplary embodiment of the present disclosure.

According to an exemplary embodiment of the present disclosure, a cavity 144 is formed so as to penetrate through only the first build-up layer 120. Here, the first build-up circuit layer 122 formed on an upper surface of the core substrate 110 is exposed to the outside by the cavity 144.

In the chip embedded board 400 according to a fourth exemplary embodiment of the present disclosure, similar to a first exemplary embodiment, an upper surface of the chip 150 is positioned so as to correspond to the outermost layer of the first build-up layer 120. That is, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

In addition, according to an exemplary embodiment of the present disclosure, an adhering layer 190 is formed between the chip 150 and the first build-up circuit layer 122 formed on the upper surface of the core substrate 110. As shown in FIG. 4, the adhering layer 190 is also formed on a portion of a side surface of the chip 150. The chip 150 is fixed to the cavity 144 by the adhering layer 190 formed as described above.

According to an exemplary embodiment of the present disclosure, the adhering layer 190 may be formed of any material used as an adhesive in the circuit board field. The adhering layer 190 is formed of, for example, a conductive adhesive to enable electrical connection between the circuit layer and the chip 150 when an electrode is formed beneath the chip 150. However, this is one of exemplary embodiments, and the adhering layer 190 may also be formed of a non-conductive adhesive.

Figure 5:
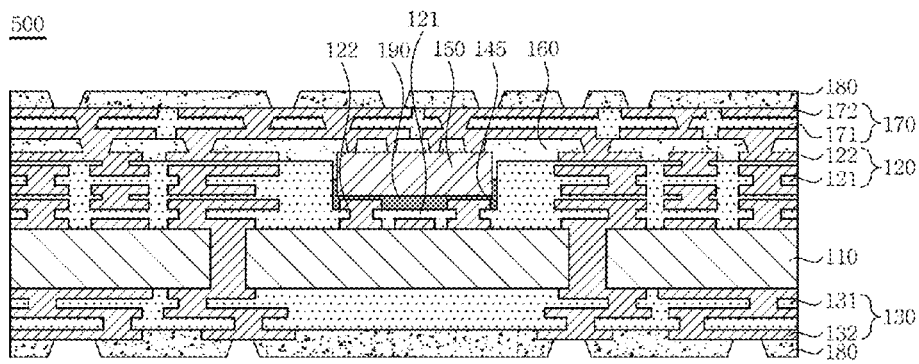
FIG. 5 is an illustrative view showing a chip embedded board according to a fifth exemplary embodiment of the present disclosure.

FIG. 5 is an illustrative view showing a chip embedded board according to a fifth exemplary embodiment of the present disclosure.

According to an exemplary embodiment of the present disclosure, a cavity 145 is formed in a groove structure in a portion of the first build-up layer 120. Here, the first build-up circuit layer 122 of the first build-up layer 120 is exposed to the outside by the cavity 145.

In the chip embedded board 500 according to a fifth exemplary embodiment of the present disclosure, similar to a first exemplary embodiment, an upper surface of the chip 150 is positioned so as to correspond to the outermost layer of the first build-up layer 120. That is, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

In addition, according to an exemplary embodiment of the present disclosure, an adhering layer 190 is formed between the chip 150 and the first build-up circuit layer 122. As shown in FIG. 5, the adhering layer 190 is also formed on a portion of a side surface of the chip 150. The chip 150 is fixed to the cavity 145 by the adhering layer 190 formed as described above.

According to an exemplary embodiment of the present disclosure, the adhering layer 190 may be formed of any material used as an adhesive in the circuit board field. The adhering layer 190 is formed of, for example, a conductive adhesive to enable electrical connection between the circuit layer and the chip 150 when an electrode is formed beneath the chip 150. However, this is one of exemplary embodiments, and the adhering layer 190 may also be formed of a non-conductive adhesive.

Method of Manufacturing Chip Embedded Board

In a method of manufacturing a chip embedded board according to an exemplary embodiment of the present disclosure, directions such as an upper portion, a lower portion, an upper surface, and a lower surface will be based on described corresponding drawings for convenience of explanation and understanding.

FIGS. 6 through 12 are illustrative views showing a method of manufacturing a chip embedded board according to a first exemplary embodiment of the present disclosure.

Figure 6:
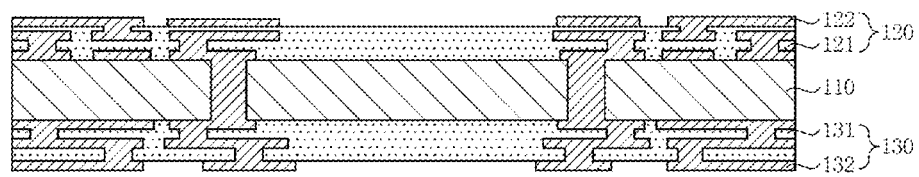
FIGS. 6 through 12 are illustrative views showing a method of manufacturing a chip embedded board according to a first exemplary embodiment of the present disclosure.

Referring to FIG. 6, the first and second build up layers 120 and 130 are formed on and beneath the core substrate 110, respectively.

According to an exemplary embodiment of the present disclosure, the core substrate 110 is formed of a composite polymer resin generally used as an interlayer insulating material. For example, the core substrate 110 may be formed of a thermosetting resin such as an epoxy resin, or a thermoplastic resin such as polyimide. Alternatively, the core substrate 110 may be formed of a resin in which a reinforcing material such as a glass fiber or an inorganic filler is impregnated in an epoxy resin such as prepreg. Alternatively, the core substrate 110 may be formed of a photo-curable resin. In addition, although not shown, the core substrate 110 may further include one or more circuit layers therein.

Alternatively, the core substrate 110 may be a ceramic substrate or a metal substrate on which an insulating film is formed. Alternatively, the core substrate 110 may be formed of a clad copper laminate (CCL).

According to an exemplary embodiment of the present disclosure, the first build-up layer 120 is formed on the core substrate 110. In addition, according to an exemplary embodiment of the present disclosure, the second build-up layer 130 is formed beneath the core substrate 110. The first build-up layer 120 according to an exemplary embodiment of the present disclosure may include one or more first build-up circuit layer 122 and first build-up insulating layer 121. In addition, the second build-up layer 130 may include one or more second build-up circuit layer 132 and second build-up insulating layer 131. Here, the first and second build-up insulating layers 121 and 131 are formed of a composite polymer resin used as an interlayer insulating material in the circuit board field. The first build-up insulating layer 121 and the second build-up insulating layer 131 are formed by a method in which they are stacked in a film form on the core substrate 110 or are applied in a liquid form onto the core substrate 110.

In addition, the first and second build-up circuit layers 122 and 132 are formed of a conductive material used in the circuit board field. For example, the first and second build-up circuit layers 122 and 132 are formed of copper. The first and second build-up circuit layers 122 and 132 may be formed by any method of forming a circuit pattern in the circuit board field. The first and second build-up circuit layers 122 and 123 are formed by, for example, a tenting method, a semi-additive process (SAP) method, or a modified semi-additive process (MSAP) method.

Figure 7:
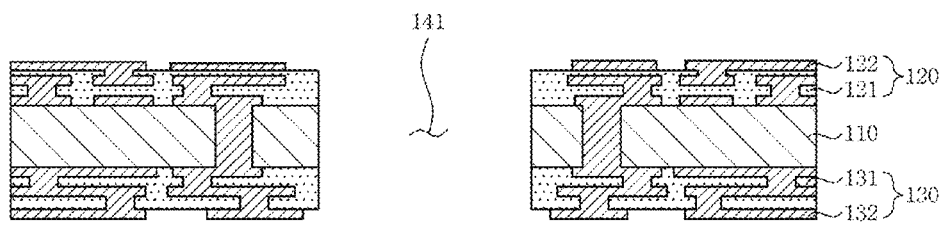

Referring to FIG. 7, the cavity 141 is drilled.

According to an exemplary embodiment of the present disclosure, the cavity 141 is formed so as to penetrate through the core substrate 110, the first build-up layer 120, and the second build-up layer 130.

According to an exemplary embodiment of the present disclosure, the cavity 141 is formed using a computerized numerical control (CNC) drill, a drill bit, or a laser drill. However, the cavity 141 is not limited to being formed by the above-mentioned drill, but may be formed by any method of forming the cavity in the circuit board field.

Figure 8:
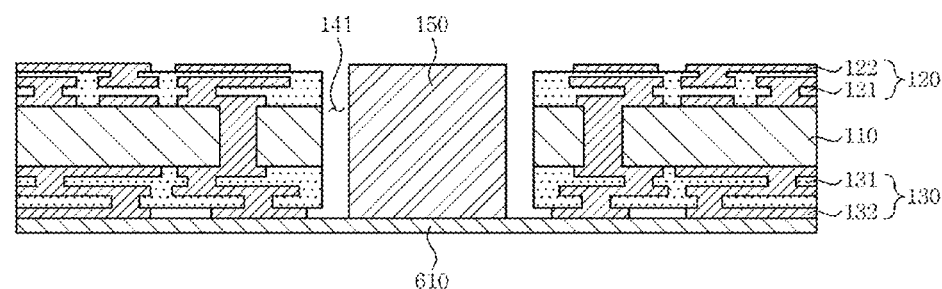

Referring to FIG. 8, the chip 150 is disposed.

According to an exemplary embodiment of the present disclosure, a carrier tape 610 is formed beneath the second build-up layer 130. According to an exemplary embodiment of the present disclosure, at least one surface of the carrier tape 610 has an adhesion property. After the carrier tape 610 is formed, the chip 150 is disposed in the cavity 141. The carrier tape 610 closes a lower portion of the cavity 141 and allows the chip 150 to be fixed to the cavity 141 by the adhesion property.

According to an exemplary embodiment of the present disclosure, when the chip 150 is disposed in the cavity 141, an upper surface of the chip 150 is disposed so as to correspond to the outermost layer of the first build-up layer 120. In an exemplary embodiment of the present disclosure, the outermost layer of the first build-up layer 120 is the first build-up circuit layer 122. Therefore, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

Figure 9:
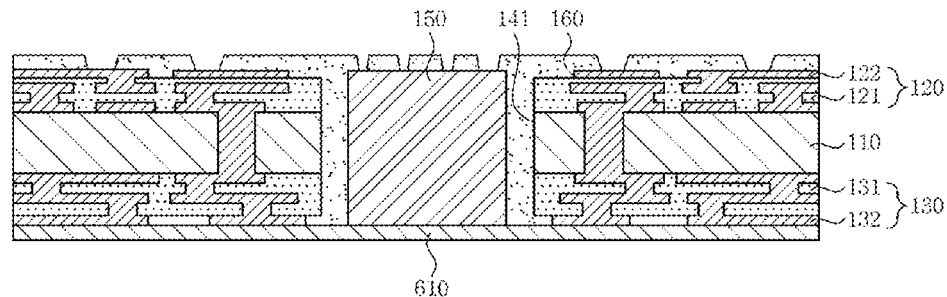

Referring to FIG. 9, the insulating layer 160 is formed.

According to an exemplary embodiment of the present disclosure, the insulating layer 160 is formed on the first build-up layer 120 and is formed so as to be filled in the cavity 141 in which the chip 150 is disposed. Here, the chip 150 is buried in the insulating layer 160.

According to an exemplary embodiment of the present disclosure, the insulating layer 160 is formed in a scheme in which it is stacked and pressed in a film form on the first build-up layer 120. Here, the insulating layer 160 is heated to be filled in the cavity 141. Alternatively, the insulating layer 160 may also be formed in a scheme in which it is applied in a liquid form onto the first build-up layer 120 and into the cavity 141.

According to an exemplary embodiment of the present disclosure, the insulating layer 160 is formed of a photosensitive insulating material. For example, the insulating layer 160 is formed of a photosensitive film or a solder resist. However, a kind of insulating layer 160 is not limited thereto, but may be any insulating material used in the circuit board field.

According to an exemplary embodiment of the present disclosure, the insulating layer 160 formed on the first build-up layer 120 is patterned. The insulating layer 160 is patterned so that an electrode of the chip 150 is exposed to the outside. In addition, the insulating layer 160 is patterned so that the first build-up circuit layer 122 electrically connected to a third build-up layer 170 to be formed later is exposed to the outside. For example, the insulating layer 160 is patterned by exposure and development processes.

As described above, the insulating layer 160 is formed of the photosensitive insulating material and is patterned by the exposure and development processes, such that fine pitches may be implemented.

Figure 10:
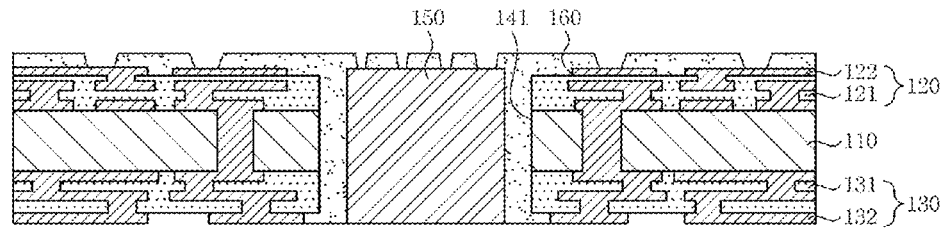

Referring to FIG. 10, the carrier tape 610 (See FIG. 9) is removed.

Although the carrier tape 610 (See FIG. 9) is removed after the insulating layer 160 is patterned in an exemplary embodiment of the present disclosure, processes of patterning the insulating layer and removing the carrier tape 610 (See FIG. 9) are not necessarily performed in the above-mentioned sequence. The insulating layer 160 may be patterned at any time after the carrier tape 610 (See FIG. 9) is removed.

Figure 11:
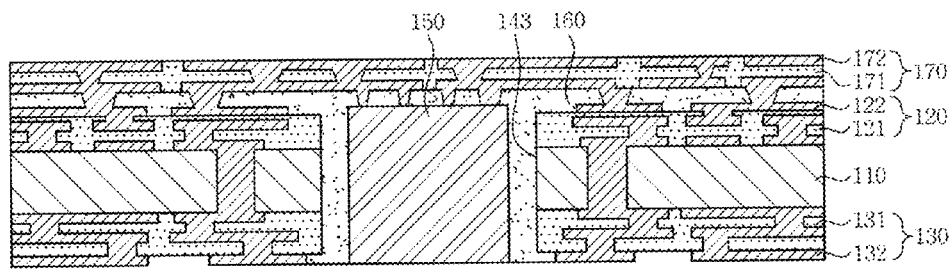

Referring to FIG. 11, the third build-up layer 170 is formed.

According to an exemplary embodiment of the present disclosure, the third build-up layer 170 is formed on the insulating layer 160. According to an exemplary embodiment of the present disclosure, the third build-up layer 170 may include one or more third circuit layer 172 and third insulating layer 171. Here, the third insulating layer 171 is formed of a composite polymer resin used as an interlayer insulating material in the circuit board field. The third insulating layer 171 is formed by a method in which it is stacked in a film form on the first build-up layer 120 or is applied in a liquid form onto the first build-up layer 120. In addition, the third circuit layer 172 is formed of a conductive material used in the circuit board field. For example, the third circuit layer 172 is formed of copper. The third circuit layer 172 may be formed by any method of forming a circuit pattern in the circuit board field. The third circuit layer 172 is formed by, for example, a tenting method, a semi-additive process (SAP) method, or a modified semi-additive process (MSAP) method.

Figure 12:
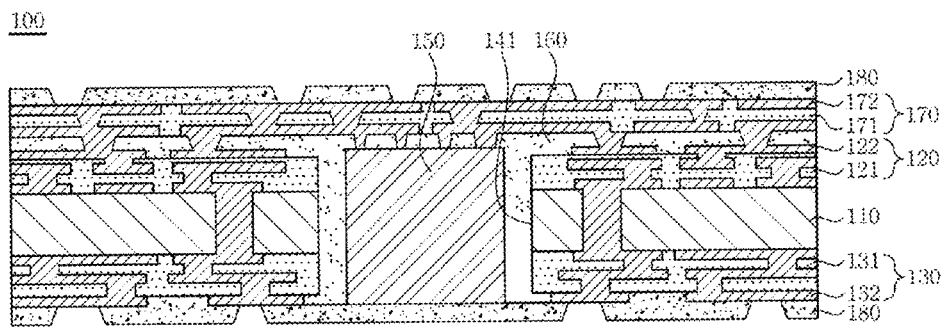

Referring to FIG. 12, the protecting layer 180 is formed.

According to an exemplary embodiment of the present disclosure, the protecting layers 180 are formed beneath the second build-up layer 130 and on the third build-up layer 170.

The protecting layers 180 according to an exemplary embodiment of the present disclosure are formed in order to protect the second and third build-up layers 130 and 170 from the outside. The protecting layers 180 are formed in a scheme in which they are stacked and pressed in a film form on the second and third build-up layers 130 and 170. Alternatively, the protecting layers 180 are formed in a scheme in which they are applied in a liquid form onto the second and third build-up layers 130 and 170. For example, the protecting layer 180 is formed of a solder resist.

According to an exemplary embodiment of the present disclosure, the protecting layers 180 are formed beneath the second build-up layer 130 and on the third build-up layer 170 and are then patterned. That is, the protecting layer 180 is patterned so that portions of the second and third build-up layers 130 and 170 electrically connected to an external component are exposed to the outside.

The chip embedded board 100 according to a first exemplary embodiment of the present disclosure shown in FIG. 1 is formed through the above-mentioned process.

In an exemplary embodiment of the present disclosure, the case in which the third build-up layer 170 is formed only on the first build-up layer 120 has been described by way of example. However, the present disclosure is not limited to the above-mentioned structure. Various build-up layers may be further formed or omitted on the first and second build-up layers 120 and 130. In addition, the second build-up layer may also be omitted.

Figure 13:
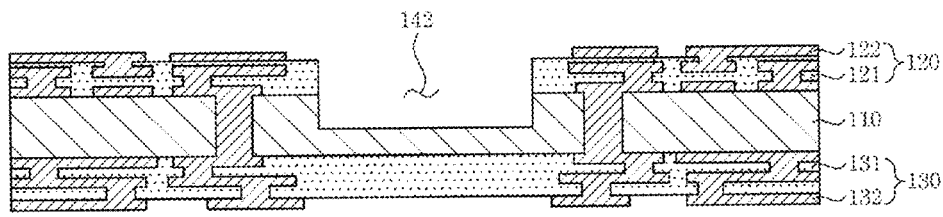
FIGS. 13 through 15 are illustrative views showing a method of manufacturing a chip embedded board according to a second exemplary embodiment of the present disclosure.
Figure 14:
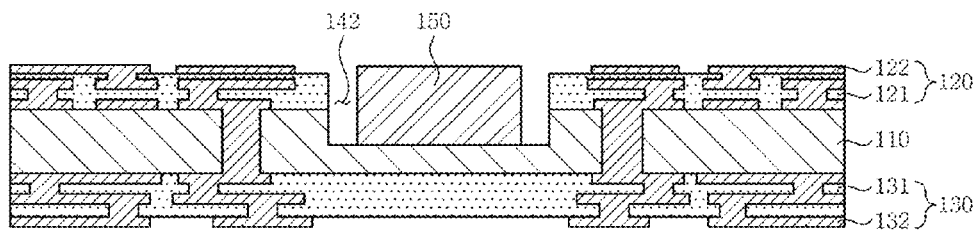
Figure 15:
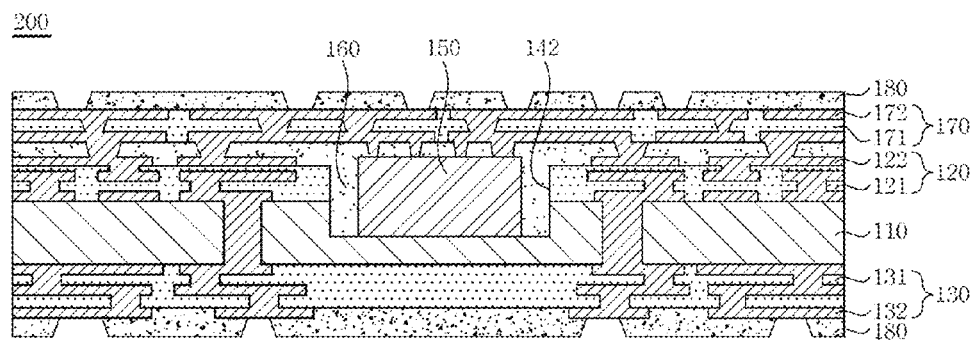

FIGS. 13 through 15 are illustrative views showing a method of manufacturing a chip embedded board according to a second exemplary embodiment of the present disclosure.

Referring to FIG. 13, the cavity 142 is formed in the first build-up layer 120 and the core substrate 110.

See FIGS. 6 and 7 with respect to a method of forming the first and second build-up layers 120 and 130 on and beneath the core substrate 110 according to an exemplary embodiment of the present disclosure, respectively.

According to an exemplary embodiment of the present disclosure, the cavity 142 is formed so as to penetrate through the first build-up layer 120. In addition, the cavity 142 is formed in a groove structure in the core substrate 110.

According to an exemplary embodiment of the present disclosure, the cavity 142 is formed using a CNC drill, a drill bit, or a laser drill. However, the cavity 142 is not limited to being formed by the above-mentioned drill, but may be formed by any method of forming the cavity in the circuit board field.

Referring to FIG. 14, the chip 150 is disposed.

According to an exemplary embodiment of the present disclosure, the chip 150 is disposed in the cavity 142. According to an exemplary embodiment of the present disclosure, when the chip 150 is disposed in the cavity 142, an upper surface of the chip 150 corresponds to the outermost layer of the first build-up layer 120. In an exemplary embodiment of the present disclosure, the outermost layer of the first build-up layer 120 is the first build-up circuit layer 122. Therefore, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

Referring to FIG. 15, the insulating layer 160, the third build-up layer 170, and the protecting layers 180 are formed.

See FIGS. 9 through 12 with respect to a method of forming the insulating layer 160, the third build-up layer 170, and the protecting layers 180 according to an exemplary embodiment of the present disclosure.

The chip embedded board 200 according to a second exemplary embodiment of the present disclosure shown in FIG. 2 is formed through processes shown in FIGS. 13 through 15.

FIGS. 16 through 21 are illustrative views showing methods of manufacturing chip embedded boards according to third and fifth exemplary embodiments of the present disclosure.

Figure 16:
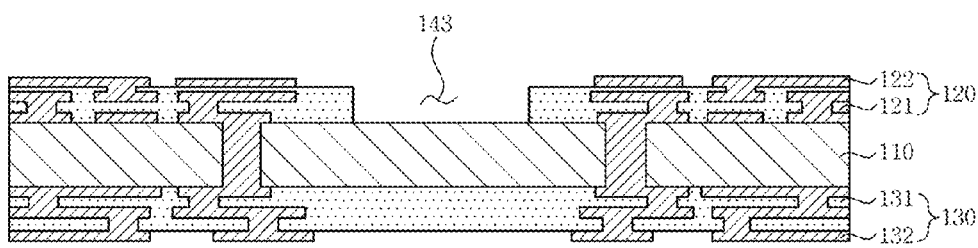
FIGS. 16 through 21 are illustrative views showing methods of manufacturing chip embedded boards according to third and fifth exemplary embodiments of the present disclosure.
Figure 17:
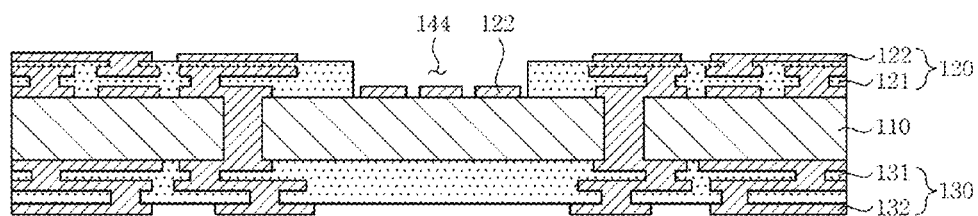
Figure 18:
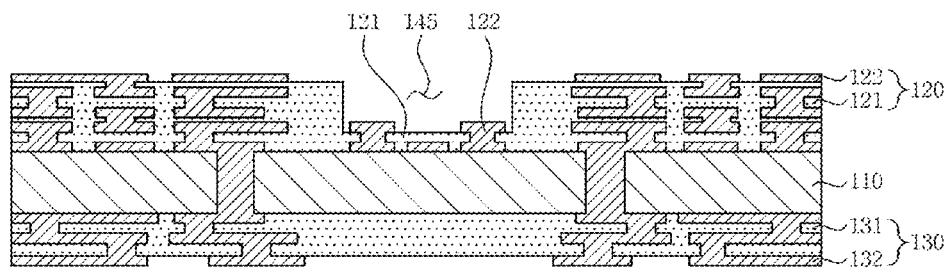

Referring to FIGS. 16 through 18, a cavity 143, 144, or 145 is formed in the first build-up layer 120.

See FIGS. 6 and 7 with respect to a method of forming the first and second build-up layers 120 and 130 on and beneath the core substrate 110 according to an exemplary embodiment of the present disclosure, respectively.

Referring to FIGS. 16 and 17, the cavity 143 or 144 according to an exemplary embodiment of the present disclosure is formed so as to penetrate through only the first build-up layer 120.

In FIG. 16, the first build-up circuit layer 122 is not formed in a region in which the cavity 143 is formed. Therefore, when the cavity 143 having a penetration form is formed, an upper surface of the core substrate 110 is exposed to the outside.

In FIG. 17, the first build-up circuit layer 122 is formed on the core substrate 110 beneath a region in which the cavity 144 is formed. Therefore, the first build-up circuit layer 122 formed on the upper surface of the core substrate 110 on which the cavity 144 having a penetration form is formed is exposed to the outside.

Referring to FIG. 18, the cavity 145 according to an exemplary embodiment of the present disclosure is formed in a groove structure in the first build-up layer 120. Therefore, the first build-up insulating layer 121 and the first build-up circuit layer 122 of the first build-up layer 120 are exposed to the outside by the cavity 145 having the groove structure.

According to an exemplary embodiment of the present disclosure, the cavity 143, 144, or 145 is formed using a CNC drill, a drill bit, or a laser drill. Alternatively, when the first build-up insulating layer 121 is formed of a photosensitive material, the cavity 143, 144, or 145 may also be formed by performing exposure and development processes.

Although the case in which the cavity 143, 144, or 145 is formed after the first build-up layer 120 is formed on the core substrate 110 has been described by way of example in an exemplary embodiment of the present disclosure, the present disclosure is not limited thereto. That is, in the method of manufacturing a chip embedded board according to an exemplary embodiment of the present disclosure, a method of forming the first build-up layer 120 in which the cavity 143, 144, or 145 is drilled in advance on the core substrate 110 may also be applied.

Figure 19:
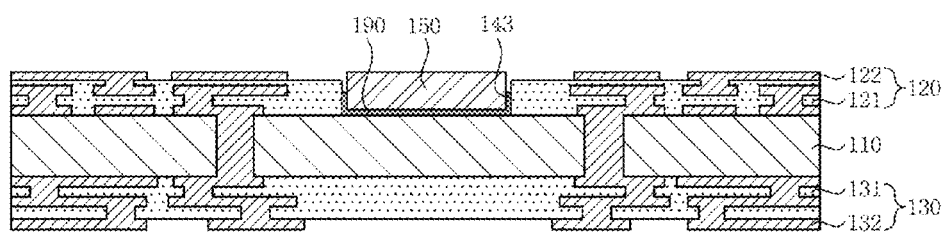
Figure 20:
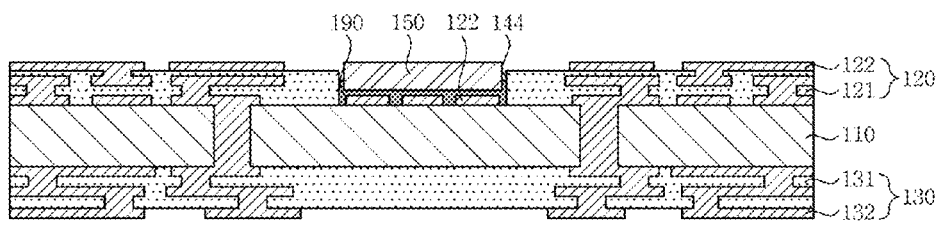
Figure 21:
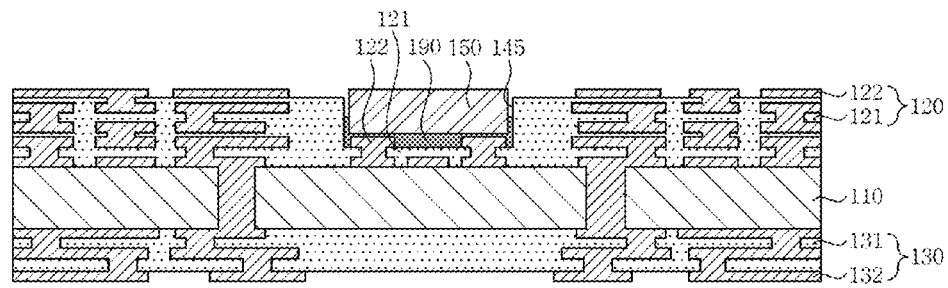

Referring to FIGS. 19 through 21, the chip 150 is disposed.

According to an exemplary embodiment of the present disclosure, the adhering layer 190 is first formed in the cavity 143, 144, or 145. According to an exemplary embodiment of the present disclosure, the adhering layer 190 may be formed of any material used as an adhesive in the circuit board field. In FIGS. 20 and 21, the chip 150 and the first build-up circuit layer 122 positioned in the cavity 143, 144, or 145 may be electrically connected to each other through the adhering layer 190. Here, the adhering layer 190 is formed of a conductive adhesive used in the circuit board field, such as a solder resist.

According to an exemplary embodiment of the present disclosure, the adhering layer 190 is formed at a bottom portion of the cavity 143, 144, or 145 or is formed at bottom and side portions.

According to an exemplary embodiment of the present disclosure, the chip 150 is stacked on the adhering layer 190 and is disposed in the cavity 143, 144, or 145. Therefore, a lower surface or a side surface of the chip 150 is adhered to the adhering layer 190.

In addition, according to an exemplary embodiment of the present disclosure, when the chip 150 is disposed in the cavity 143, 144, or 145, the upper surface of the chip 150 is disposed so as to correspond to the outermost layer of the first build-up layer 120. Therefore, the upper surface of the chip 150 is positioned on an upper surface of the first build-up insulating layer 121, on an upper surface of the first build-up circuit layer 122, or between the upper surface of the first build-up insulating layer 121 and the upper surface of the first build-up circuit layer 122.

In an exemplary embodiment of the present disclosure, a position of the upper surface of the chip 150 may also be adjusted by changing a thickness of the adhering layer 190.

See FIGS. 9 through 12 with respect to a method of forming the insulating layer 160, the third build-up layer 170, and the protecting layers 180 according to an exemplary embodiment of the present disclosure after the chip 150 is disposed in the cavity 143, 144, or 145. The chip embedded boards 300, 400, and 500 according to third and fifth exemplary embodiments of the present disclosure shown in FIGS. 3 through 5 are manufactured through the above-mentioned method.

FIGS. 22 through 26 are other illustrative views showing a method of manufacturing a chip embedded board according to a third exemplary embodiment of the present disclosure.

Figure 22:
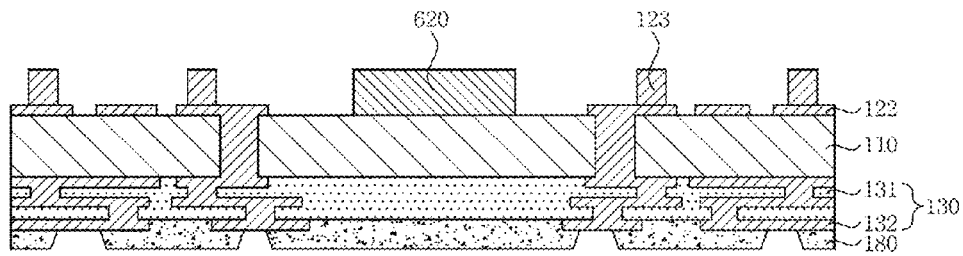
FIGS. 22 through 26 are other illustrative views showing a method of manufacturing a chip embedded board according to a third exemplary embodiment of the present disclosure.

Referring to FIG. 22, a cavity metal layer 620 is formed on the core substrate 110.

According to an exemplary embodiment of the present disclosure, the protecting layer 180 is formed beneath the core substrate 110. Here, the protecting layer 180 is in a state in which it is patterned so that the second build-up circuit layer 132 connected to an external component is exposed to the outside.

According to an exemplary embodiment of the present disclosure, the cavity metal layer 620 is formed on the core substrate 110 by an electroplating method. The cavity metal layer 620 according to an exemplary embodiment of the present disclosure is formed so as to have a thickness at which it penetrates through a first build-up layer 120 to be formed later. However, a method of forming the cavity metal layer 620 is not limited to the electroplating method. That is, the cavity metal layer 620 according to an exemplary embodiment of the present disclosure may also be formed by bonding a metal foil to the core substrate 110.

According to an exemplary embodiment of the present disclosure, the cavity metal layer 620 is formed at a position at which the cavity (not shown) in which the chip (not shown) is disposed later is formed.

According to an exemplary embodiment of the present disclosure, when the cavity metal layer 620 is formed, metal posts 123 are formed at at least one side of the cavity metal layer 620. The metal posts 123 according to an exemplary embodiment of the present disclosure may be formed by the same process as a process of forming the cavity metal layer 620. According to an exemplary embodiment of the present disclosure, the metal posts 123 are formed on the first build-up circuit layer 122 formed on the core substrate 110 in advance or on the core substrate 110. Here, the metal posts 123 serve as vias electrically connecting first build-up circuit layers (not shown) of a first build-up layer (not shown) to each other later.

Figure 23:
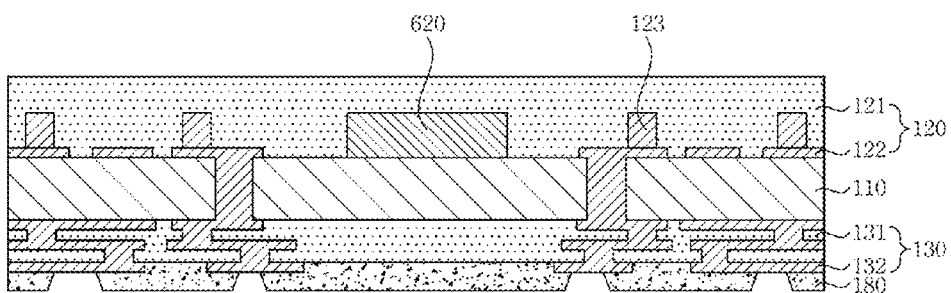

Referring to FIG. 23, the first build-up insulating layer 121 is formed.

According to an exemplary embodiment of the present disclosure, the first build-up insulating layer 121 is formed on the core substrate 110 to bury the metal posts 123 and the cavity metal layer 620 therein.

Figure 24:
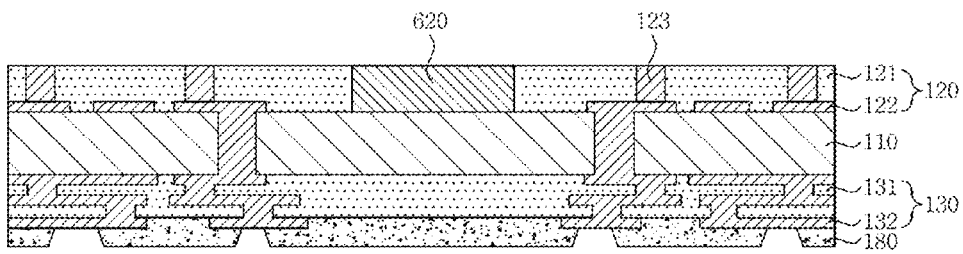

Referring to FIG. 24, the first build-up insulating layer 121 is planarized.

According to an exemplary embodiment of the present disclosure, an upper portion of the first build-up insulating layer 121 is polished, such that an upper surface of the first build-up insulating layer 121 is planarized. Here, the first build-up insulating layer 121 exposes upper surfaces of the metal posts 123 and the cavity metal layer 620 to the outside. As a method of polishing the first build-up insulating layer 121 according to an exemplary embodiment of the present disclosure, any method of polishing an insulating layer in the circuit board field may be used.

According to an exemplary embodiment of the present disclosure, although the first build-up insulating layer 121 is formed so as to bury the cavity metal layer 620 therein and is then polished, the present disclosure is not limited to the above-mentioned method and sequence. For example, when the first build-up insulating layer 121 is formed on the core substrate 110, the first build-up insulating layer 121 may be formed so that the upper surfaces of the cavity metal layer 620 and the meal posts 123 are exposed. As described above, as a method of forming the first build-up insulating layer 121 exposing the upper surface of the cavity metal layer 620 to the outside, any known method may be used.

Figure 25:
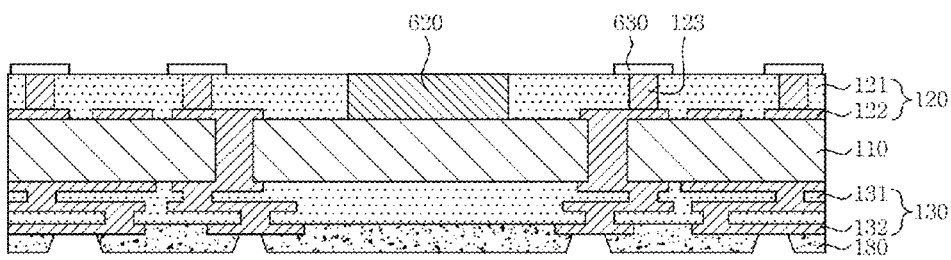

Referring to FIG. 25, etching resists 630 are formed.

According to an exemplary embodiment of the present disclosure, the etching resists 630 are formed on the metal posts 123. Here, the etching resists 630 are formed so that the upper surface of the cavity metal layer 620 is exposed to the outside.

Figure 26:
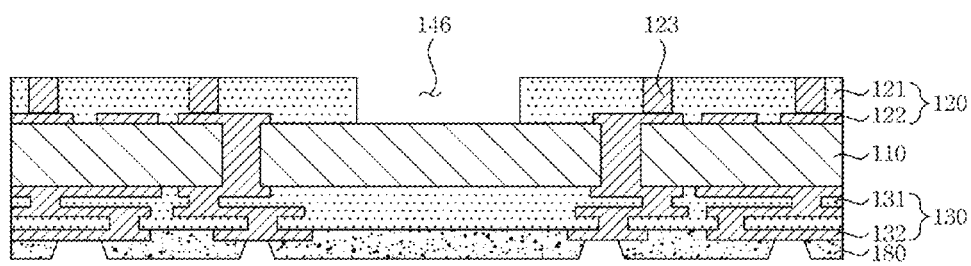

Referring to FIG. 26, a cavity 146 is formed.

According to an exemplary embodiment of the present disclosure, the cavity metal layer 620 exposed to the outside is removed by an etching process. Here, the metal posts 123 are protected from the etching process by the etching resists 630 (See FIG. 25).

According to an exemplary embodiment of the present disclosure, as a method of removing the cavity metal layer 620, any method of removing a metal in the circuit board field may be used.

According to an exemplary embodiment of the present disclosure, the etching resists 630 (See FIG. 25) are also removed after the cavity metal layer 620 is removed.

Figure 27:
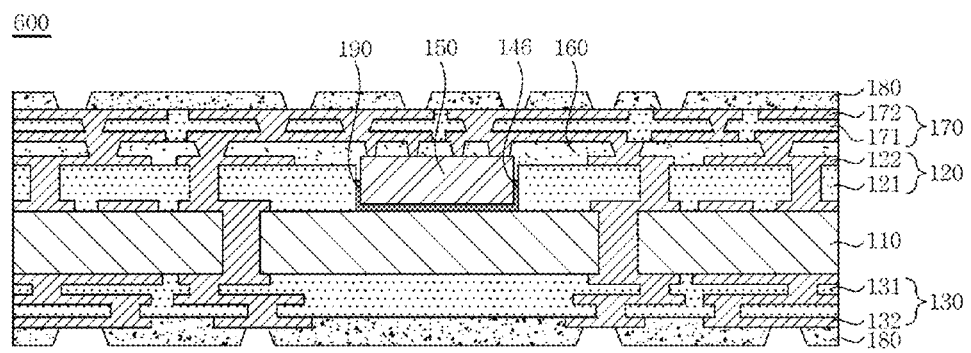
FIG. 27 is a view showing a chip embedded board manufactured according to a sixth exemplary embodiment of the present disclosure.

FIG. 27 is a view showing a chip embedded board manufactured according to a sixth exemplary embodiment of the present disclosure.

According to an exemplary embodiment of the present disclosure, the chip 150 is disposed in the cavity 146. Then, the insulating layer 160 and the third build-up layer 170 are formed.

Here, see FIGS. 19 through 21 with respect to a method of forming the chip 150, the insulating layer 160, and the third build-up layer 170.

The chip embedded board 600 according to a sixth exemplary embodiment of the present disclosure is manufactured through the above-mentioned method.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A chip embedded board comprising:
   a core substrate;
   a first build-up layer comprising a plurality of build-up insulating layers and formed on a first surface of the core substrate;
   a second build-up layer formed on a second surface of the core substrate;
   a cavity penetrating through the core substrate, the first build-up layer and the second build-up layer;
   a chip disposed in the cavity; and
   an insulating layer filled in the cavity,
      wherein:
         the second build-up layer comprises a plurality of build-up insulating layers and a plurality of circuit layers,
         the number of the build-up insulating layers of the first build-up layer and number of the build-up insulating layers of the second build-up layer are equal, and
         an upper surface of the chip is disposed between a build-up insulating layer among the plurality of build-up insulating layers of the first build-up layer and which is positioned at an outermost layer of the first build-up layer and a circuit layer of the first build-up layer which is positioned at another outermost layer of the first build-up layer, and a lower surface of the chip is disposed between a build-up insulating layer of the second build-up layer among the plurality of build-up insulating layers of the second build-up layer and which is positioned at an outermost layer of the second build-up layer and a circuit layer among the plurality of circuit layers of the second build-up layer and which is positioned at another outermost layer of the second build-up layer.

2. The chip embedded board of claim 1, wherein the insulating layer is formed of a photosensitive insulating material.

3. The chip embedded board of claim 1, further comprising an adhering layer formed between the lower surface of the chip and the cavity.

4. The chip embedded board of claim 3, wherein the adhering layer is further formed between a side surface of the chip and the cavity, in which the side surface comprises a surface perpendicular to the upper surface and the lower surface of the chip.

5. A method of manufacturing a chip embedded board, comprising:
   forming a first build-up layer, comprising a plurality of build-up insulating layers, on a first surface of a core substrate;
   forming a second build-up layer on a second surface of the core substrate;
   forming a cavity penetrating through the core substrate, the first build-up layer and the second build-up layer;
   disposing a chip in the cavity; and
   forming an insulating layer in the cavity,
      wherein:
         the first build-up layer comprises a plurality of build-up insulating layers and a plurality of circuit layers,
         the second build-up layer comprises a plurality of build-up insulating layers and a plurality of circuit layers,
         the number of build-up insulating layers of the first build-up layer and the number of build-up insulating layers of the second build-up layer are equal, and
         an upper surface of the chip is disposed between a build-up insulating layer among the plurality of build-up insulating layers of the first build-up layer and which is positioned at an outermost layer of the first build-up layer and a circuit layer of the first build-up layer which is positioned at another outermost layer of the first build-up layer, and a lower surface of the chip is disposed between a build-up insulating layer of the second build-up layer among the plurality of build-up insulating layers of the second build-up layer and which is positioned at an outermost layer of the second build-up layer and a circuit layer among the plurality of circuit layers of the second build-up layer and which is positioned at another outermost layer of the second build-up layer.

6. The method of manufacturing a chip embedded board of claim 5, wherein in the forming of the insulating layer, the insulating layer is formed of a photosensitive insulating material.

7. The method of manufacturing a chip embedded board of claim 5, further comprising, after the forming of the first build-up layer, forming an adhering layer in the cavity.

* * * * *